(12) United States Patent
Mikamoto et al.

(10) Patent No.: US 10,141,088 B2
(45) Date of Patent: Nov. 27, 2018

(54) RESISTOR

(71) Applicant: Panasonic Intellectual Property Management Co., Ltd., Osaka (JP)

(72) Inventors: Naohiro Mikamoto, Fukui (JP); Fuyuki Abe, Kyoto (JP); Yuji Yasuoka, Osaka (JP); Akimitsu Fujii, Osaka (JP); Shogo Nakayama, Fukui (JP); Takeshi Iseki, Nara (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 0 days.

(21) Appl. No.: 15/527,319

(22) PCT Filed: Dec. 19, 2016

(86) PCT No.: PCT/JP2016/005177
§ 371 (c)(1),
(2) Date: May 16, 2017

(87) PCT Pub. No.: WO2017/110079
PCT Pub. Date: Jun. 29, 2017

(65) Prior Publication Data
US 2017/0365380 A1    Dec. 21, 2017

(30) Foreign Application Priority Data
Dec. 22, 2015 (JP) .................. 2015-250143

(51) Int. Cl.
*H01C 1/084* (2006.01)
*G01R 1/20* (2006.01)
(Continued)

(52) U.S. Cl.
CPC ............ *H01C 1/084* (2013.01); *G01R 1/203* (2013.01); *H01C 1/028* (2013.01); *H01C 1/032* (2013.01);
(Continued)

(58) Field of Classification Search
CPC ......... H01C 1/084; H01C 1/028; G01R 1/203
(Continued)

(56) References Cited

U.S. PATENT DOCUMENTS

| 2009/0322467 A1 | 12/2009 | Hetzler | |
| 2014/0367153 A1* | 12/2014 | Yoneda | H01C 1/014 174/260 |
| 2016/0343479 A1* | 11/2016 | Itou | H01C 1/084 |

FOREIGN PATENT DOCUMENTS

| JP | 2010-514171 | 4/2010 |
| WO | 2015/129161 | 9/2015 |

OTHER PUBLICATIONS

International Search Report of PCT application No. PCT/JP2016/005177 dated Feb. 28, 2017.

* cited by examiner

*Primary Examiner* — Iman Malakooti
(74) *Attorney, Agent, or Firm* — McDermott Will & Emery LLP (57) ABSTRACT

A resistor includes a resistive element, a first resin substrate on an upper surface of the resistive element and having a high thermal conductivity, a first heat radiator plate made of metal provided on an upper surface of the first resin substrate, a second heat radiator plate made of metal provided on the upper surface of the first resin substrate, a first edge-surface electrode provided on the first edge surface of the resistive element and connected to the first heat radiator plate, and a second edge-surface electrode provided on the (Continued)

second edge surface of the resistive element and connected to the second heat radiator plate.

20 Claims, 8 Drawing Sheets (51) Int. Cl.
    *H01C 1/028*     (2006.01)
    *H01C 1/14*     (2006.01)
    *H01C 7/00*     (2006.01)
    *H01C 7/06*     (2006.01)
    *H01C 1/032*     (2006.01)

(52) U.S. Cl.
    CPC ............... *H01C 1/14* (2013.01); *H01C 7/003* (2013.01); *H01C 7/06* (2013.01)

(58) Field of Classification Search
    USPC .......................................... 338/226
    See application file for complete search history.

RESISTOR

CROSS-REFERENCE TO RELATED APPLICATIONS

This application is a U.S. national stage application of the PCT international application No.PCT/JP2016/005177 filed on Dec. 19, 2016, which claims the benefit of foreign priority of Japanese patent application No. 2015-250143 filed on Dec. 22, 2015, the contents all of which are incorporated herein by reference.

TECHNICAL FIELD

The present invention relates to a resistor having a low resistance and a high withstanding voltage used for, e.g. detecting current values of various electronic devices.

BACKGROUND ART

Figure 6:
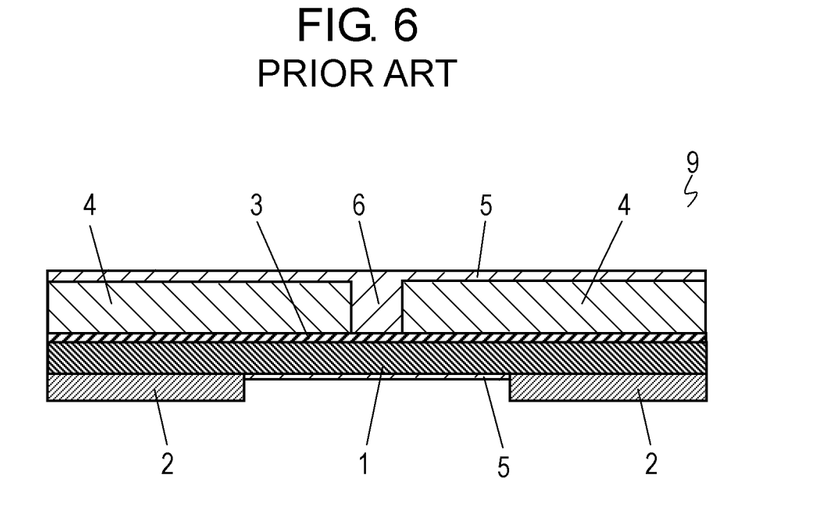
FIG. 6 is a cross-sectional view of a conventional resistor.

FIG. 6 is a cross-sectional view of conventional resistor 9. Resistor 9 includes resistive element 1 made of a metal having a plate shape or a foil shape, a pair of electrodes 2 formed on both end portions of an upper surface of resistive element 1, heat radiator plate 4 having a high thermal conductivity bonded to a lower surface of resistive element 1 via adhesive 3, and protective film 5 formed between the pair of electrodes 2 and on an upper surface of heat radiator plate 4. Heat radiator plate 4 is divided into two parts by gap 6.

A conventional resistor similar to resistor 9 is disclosed in, e.g. PTL 1.

CITATION LIST

Patent Literature

PTL 1: Japanese Patent Laid-Open Publication No. 2010-514171

SUMMARY

A resistor includes a resistive element, a first resin substrate on an upper surface of the resistive element and having a high thermal conductivity, a first heat radiator plate made of metal provided on an upper surface of the first resin substrate, a second resin substrate on an upper surface of the first heat radiator plate, a second heat radiator plate made of metal provided on the upper surface of the second resin substrate, a first edge-surface electrode provided on the first edge surface of the resistive element and connected to the first heat radiator plate, and a second edge-surface electrode provided on the second edge surface of the resistive element and connected to the second heat radiator plate.

The resistor can reduce temperature of the resistive element significantly, thereby improving its long term reliability.

DETAIL DESCRIPTION OF PREFERRED EMBODIMENTS

Exemplary Embodiment 1

Figure 1A:
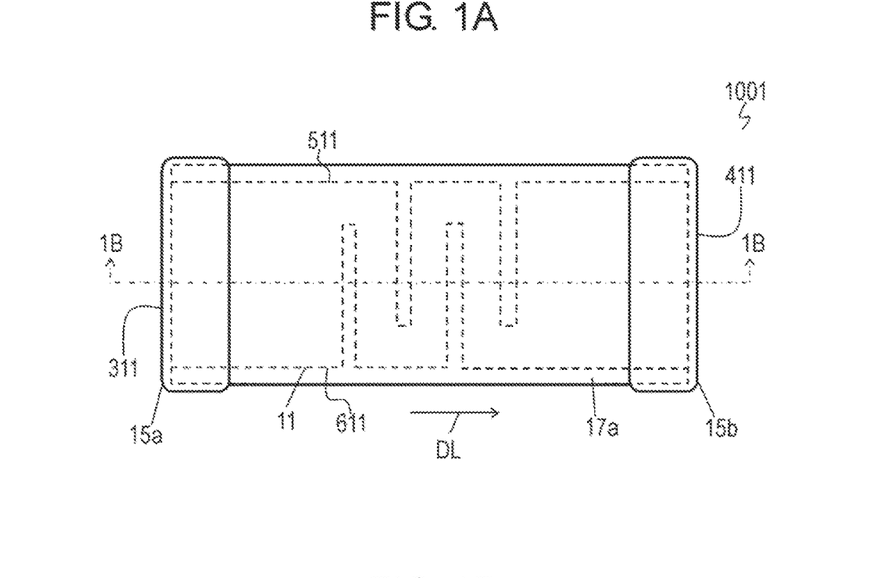
FIG. 1A is a top view of a resistor in accordance with Exemplary Embodiment 1.
Figure 1B:
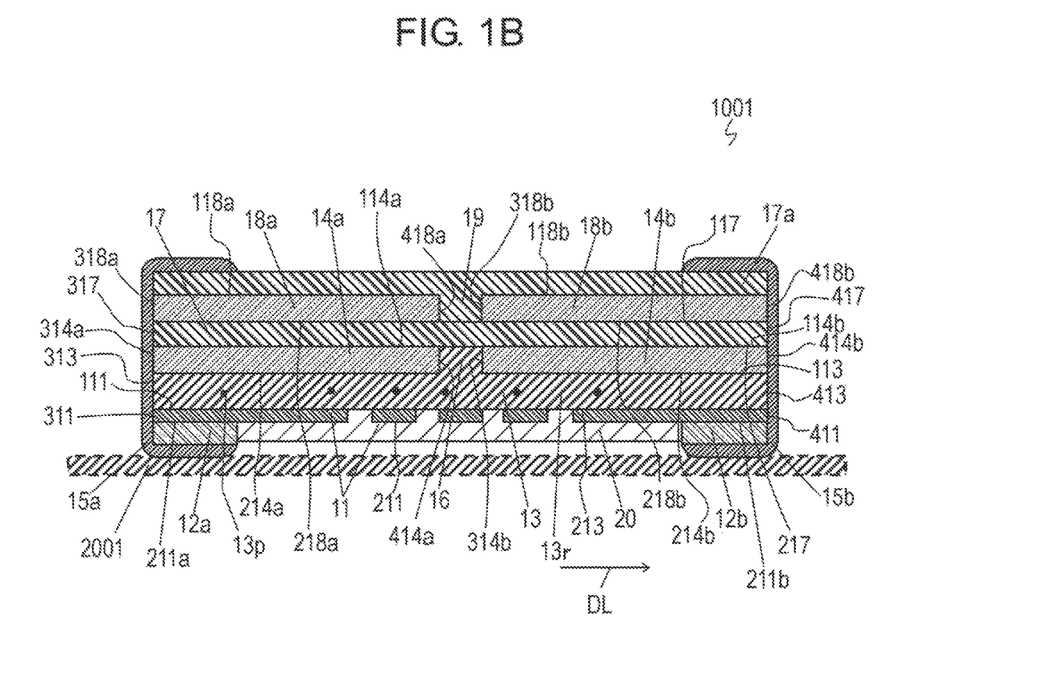
FIG. 1B is a cross-sectional view of the resistor along line 1B-1B shown in FIG. 1A.

FIG. 1A is a top view of resistor 1001 in accordance with Exemplary Embodiment 1. FIG. 1B is a cross-sectional view of resistor 1001 along line 1B-1B shown in FIG. 1A. Resistor 1001 includes resistive element 11 made of metal, lower electrodes 12a and 12b provided on lower surface 211 of resistive element 11, resin substrate 13 having a high thermal conductivity and provided on upper surface 111 of resistive element 11, heat radiator plates 14a and 14b provided on upper surface 113 of resin substrate 13, and edge-surface electrodes 15a and 15b provided on resistive element 11. Resistive element 11 is made of metal and has upper surface 111, lower surface 211, and edge surfaces 311, 411, 511, and 611 each connected to upper surface 111 and lower surface 211. Edge surfaces 311 and 411 are located opposite to each other while edge surfaces 511 and 611 are located opposite to each other. Lower electrode 12a is provided on end portion 211a of lower surface 211 connected to edge surface 311 of resistive element 11. Lower electrode 12b is provided on end portion 211b of lower surface 211 connected to edge surface 411 of resistive element 11. Edge-surface electrodes 15a and 15b are provided on edge surfaces 311 and 411 of resistive element 11, respectively. Edge surface 411 of resistive element 11 is opposite to edge surface 311 of resistive element 11 and is located in longitudinal direction DL from edge surface 311 of resistive element 11. A current flows mainly between edge-surface electrodes 15a and 15b in longitudinal direction DL.

As shown in FIG. 1B, resistor 1001 is mounted on mounting board 2001.

Heat radiator plates 14a and 14b are made of metal. Heat radiator plates 14a and 14b are separated from each other via gap 16 in between, and are connected to edge-surface electrodes 15a and 15b, respectively.

Resistor 1001 further includes resin substrate 17 provided on upper surfaces 114a and 114b of heat radiator plates 14a and 14b, and heat radiator plates 18a and 18b provided on upper surface 117 of resin substrate 17. Heat radiator plates 18a and 18b are made of metal. Heat radiator plates 18a and 18b are separated from each other via gap 19 in between, and are connected to edge-surface electrodes 15a and 15b, respectively. Resin substrate 13 has upper surface 113, lower surface 213 situated on upper surface 111 of resistive element 11, end 313 connected to upper surface 113 and lower surface 213, and end 413 connected to upper surface 113 and lower surface 213. End 413 of resin substrate 13 is opposite to end 313 of resin substrate 13 and located in longitudinal direction DL from end 313 of resin substrate 13.

Heat radiator plate 14a has upper surface 114a, lower surface 214a situated on upper surface 113 of resin substrate 13, end 314a connected to upper surface 114a and lower surface 214a, and end 414a connected to upper surface 114a and lower surface 214a. End 414a of heat radiator plate 14a is opposite to end 314a of heat radiator plate 14a and located in longitudinal direction DL from end 314a of heat radiator plate 14a. End 314a is connected to edge-surface electrode 15a. Heat radiator plate 14b has upper surface 114b, lower surface 214b situated on upper surface 113 of resin substrate 13, end 414b connected to upper surface 114b and lower surface 214b, and end 314b connected to upper surface 114b and lower surface 214b. End 414b is connected to edge-surface electrode 15b. End 314b is located opposite to end 414b of heat radiator plate 14b and in a direction opposite to longitudinal direction DL from end 414b. End 414b is connected to edge-surface electrode 15b. End 414a of heat radiator plate 14a faces end 314b of heat radiator plate 14b via gap 16 in between.

Resin substrate 17 has upper surface 117, lower surface 217 situated on upper surfaces 114a and 114b of heat radiator plates 14a and 14b, end 317 connected to upper surface 117 and lower surface 217, and end 417 connected to upper surface 117 and lower surface 217. End 417 of resin substrate 17 is opposite to end 317 of resin substrate 17 and is located in longitudinal direction DL from end 317.

Heat radiator plate 18a has upper surface 118a, lower surface 218a situated on upper surface 117 of resin substrate 17, end 318a connected to upper surface 118a and lower surface 218a, and end 418a connected to upper surface 118a and lower surface 218a. End 418a is opposite to end 318a of heat radiator plate 18a and is in longitudinal direction DL from end 318a. End 318a is connected to edge-surface electrode 15a. Heat radiator plate 18b has upper surface 118b, lower surface 218b located on upper surface 117 of resin substrate 17, end 418b connected to upper surface 118b and lower surface 218b, and end 318b connected to upper surface 118b and lower surface 218b. End 318b is opposite to end 418b of heat radiator plate 18b and is located in a direction opposite to longitudinal direction DL from end 418b. End 418b is connected to edge-surface electrode 15b. End 418a of heat radiator plate 18a faces end 318b of heat radiator plate 18b via gap 19 in between.

Resistive element 11 has a plate shape or a foil shape and is made of material of CuMnNi (Manganin) Resistive element 11 may be made of other metallic material, such as CuNi, CuMn, NiCr, CuNiSn, or CuMnSn, and is more preferably made of CuMnNi, which has a low temperature coefficient of resistance (TCR).

The broken line in FIG. 1A illustrates the shape of resistive element 11. Resistive element 11 is processed to form a meandering shape by, e.g. etching. In accordance with Embodiment 1, the meandering portion of resistive element 11 is located near the center of resistive element 11 in longitudinal direction DL. To have a resistance adjusted, resistive element 11 may have one or more trimming grooves provided therein.

Lower electrodes 12a and 12b are formed by directly plating lower surface 211 of resistive element 11 with metallic material based on Cu. Lower electrodes 12a and 12b may be formed by welding or clad-bonding a metal plate provided separately from resistor 1001 onto lower surface 211 of resistive element 11, or the above-mentioned metallic material is sputtered or printed on lower surface 211 of the resistive element 11.

Protective film 20 made of epoxy resin or silicon resin is provided on lower surface 211 of resistive element 11 and between lower electrodes 12a and 12b.

Resin substrate 13 directly contacting upper surface 111 of resistive element 11 is made of mixture containing resin 13r and ceramic powder 13p dispersed in resin 13r. In accordance with the embodiment, resin 13r is an epoxy resin while ceramic powder 13p is alumina powder.

Ceramic powder 13p provides resin substrate 13 with a high thermal conductivity and a high insulating property. Resin substrate 13 further contains resin 13r. Thus, resistive element 11 and heat radiator plates 14a and 14b are bonded tightly by pressing without adhesive, so that high adhesive properties can be obtained. Accordingly, resin substrate 13 provides both of thermal conductivity and adhesive properties.

Ceramic powder 13p may be contained in resin substrate 13 preferably at a range from 30 vol. % to 90 vol. % or from 85 wt. % to 98 wt. %. If the amount of the ceramic powder 13p is not enough, the thermal conductivity will be deteriorated. If the amount of ceramic powder 13p is excessive, the adhesive property will be deteriorated.

Silica powder may be employed as ceramic powder 13p, but alumina powder is more preferable because of high thermal conductivity.

Resin substrate 13 has a thickness larger than a thickness of each of heat radiator plates 14a, 14b, 18a, and 18b.

Each of heat radiator plates 14a and 14b is directly formed on a respective one of end potions connected to ends 313 and 413 and arranged on upper surface 113 of resin substrate 13 in longitudinal direction DL. Heat radiator plates 14a and 14b are separated from each other via gap 16 in between. Heat radiator plates 14a, 14b, 18a, and 18b are made of metal, such as Cu. End 314a of heat radiator plate 14a is connected to edge-surface electrode 15a while end 414b of heat radiator plate 14b is connected to edge-surface electrode 15b.

Edge-surface electrode 15a is formed by sputtering a metal, such as copper or nichrome, on edge surface 311 of resistive element 11, lower electrode 12a, end 313 of resin substrate 13, end 314a of heat radiator plate 14a, end 317 of resin substrate 17, and end 318a of heat radiator plate 18a. Edge-surface electrode 15b is formed by sputtering metal, such as copper or nichrome, on edge surface 411 of resistive element 11, lower electrode 12b, end 413 of resin substrate 13, end 414b of heat radiator plate 14b, end 417 of resin substrate 17, and end 418b of heat radiator plate 18b. A metal layer, such as a copper layer, a nickel plating layer, or a tinning layer, is formed on each surface of edge-surface electrodes 15a and 15b. When resistor 1001 is mounted, a solder plating layer for mounting is provided on a surface of the metal layer.

Resin substrate 17 is provided on upper surfaces of heat radiator plates 14a and 14b, and is made of glass epoxy identical to a material contained in mounting board 2001.

Heat radiator plate 18a is formed on an end portion of upper surface 117 of resin substrate 17 connected to end 317 of upper surface 117 of resin substrate 17. Heat radiator plate 18b is formed on an end portion of upper surface 117 of resin substrate 17 connected to end 417 of upper surface 117 of resin substrate 17. Heat radiator plate 18a is separated from heat radiator plate 18b via gap 19 in between. Heat radiator plates 18a and 18b are made of metal, such as Cu. End 318a of heat radiator plate 18a is connected to edge-surface electrode 15a while end 418b of heat radiator plate 18b is connected to edge-surface electrode 15b.

Heat radiator plates 14a and 14b are formed by bonding a metal plate made of, e.g. Cu, to upper surface 113 of resin substrate 13. Heat radiator plates 18a and 18b are formed by bonding a metal plate made of, e.g. Cu, to upper surface 117 of resin substrate 17.

Gap 16 between heat radiator plates 14a and 14b prevents a current path from being formed between heat radiator plates 14a and 14b. Gap 19 between heat radiator plates 18a and 18b prevents a current path from being formed between heat radiator plates 18a and 18b.

Widths of gaps 16 and 19 in longitudinal direction DL are preferably more than or equal to 1/50 of the total length (length of resin substrate 13 or resin substrate 17) of resistor 1001 in longitudinal direction DL. If the widths of gaps 16 and 19 in longitudinal direction DL exceed 1/10 of the total length of resistor 1001 in longitudinal direction DL, the length of heat radiator plates 14a, 14b, 18a, and 18b in longitudinal direction DL will be shortened. This configuration deteriorates heat radiation effects, which is not desirable.

Resin substrate 17a made of glass epoxy is formed on upper surfaces of heat radiator plates 18a and 18b. A protective film may be formed on an upper surface of resin substrate 17a.

Conventional resistor 9 shown in FIG. 6 hardly allows heat generated in resistive element 1 to transmit to heat radiator plate 4 due to insulating adhesive 3 between heat radiator plate 4 and resistive element 1. Accordingly, a temperature of resistive element 1 remains high, thereby deteriorating long term reliability.

Resistor 1001 in accordance with Embodiment 1 allow heat generated in resistive element 11 due to a current to transmit to heat radiator plates 14a, 14b, 18a, and 18b via resin substrates 13 and 17. The heat transmits to heat radiator plates 14a, 14b, 18a, and 18b is emitted to mounting board 2001 through edge-surface electrodes 15a and 15b and lower electrodes 12a and 12b. This configuration reduces the temperature of resistive element 11, so that the rated power of resistor 1001 may increase and the long term reliability thereof is improved.

The meandering portion of resistive element 11 serves as a hot spot having a larger amount of heat than portions of resistive element 11 other than the meandering portion. The hot spot of resistive element 11 may not preferably overlap gaps 16 and 19 viewing from above. Thus, the heat generated at the hot spot easily transmits to heat radiator plates 14a, 14b, 18a, and 18b.

A method of manufacturing resistor 1001 in accordance with Embodiment 1 will be described below.

First, a metal plate having portions corresponding to heat radiator plate 14a, heat radiator plate 14b, and gap 16 to constitute heat radiator plates 14a and 14b is prepared. A metal plate having portions corresponding to heat radiator plate 18a, heat radiator plate 18b, and gap 19 to constitute heat radiator plates 18a and 18b is prepared. The metal plate constituting heat radiator plates 18a and 18b is bonded to upper surface 117 of resin substrate 17 by hot pressing. The metal plate constituting heat radiator plates 14a and 14b is bonded to lower surface 217 of resin substrate 17 by hot pressing. Then, the metal plate constituting heat radiator plates 14a and 14b is etched to form gap 16. The metal plate constituting heat radiator plates 18a and 18b is etched to form gap 19. Thus, heat radiator plates 14a and 14b are formed on both end portions of lower surface 217 of resin substrate 17 while heat radiator plates 18a and 18b are formed on both end portions of upper surface 117 of resin substrate 17.

Next, another resin substrate 17a, resin substrate 17, resin substrate 13, and resistive element 11 are stacked, and then pressed as to bond resin substrate 13, resistive element 11, and heat radiator plates 14a and 14b. At this moment, gap 16 is filled with resin substrate 13 while gap 19 is filled with resin substrate 17a.

Then, resistive element 11 is etched as to have the meandering shape shown in FIG. 1A, and then lower electrodes 12a and 12b are formed on end portions of lower surface 211 of resistive element 11 by plating.

Then, trimming grooves are formed in resistive element 11 to adjust the resistance.

Next, epoxy resin or silicon resin is applied onto lower surface 211 of resistive element 11 between lower electrode 12a and lower electrode 12b, and then, is dried to form protective film 20.

Finally, copper or nichrome is sputtered on ends of resistive element 11, lower electrode 12a, resin substrate 13, heat radiator plate 14a, resin substrate 17, and heat radiator plate 18a to form edge-surface electrode 15a. Copper or nichrome is sputtered on ends of resistive element 11, lower electrode 12b, resin substrate 13, heat radiator plate 14b, resin substrate 17, and heat radiator plate 18b to form edge-surface electrode 15b. After that, a copper layer, a nickel plating layer, or a tinning layer is formed on each surface of edge-surface electrodes 15a and 15b.

In resistor 1001 according to Embodiment 1, resin substrate 13 with high thermal conductivity is made of a mixture of an epoxy resin (resin 13r) and alumina powder (ceramic powder 13p). Resin substrate 13 directly contacts resistive element 11 while resin substrate 13 directly contacts heat radiator plates 14a and 14b. Therefore, most of the heat generated in resistive element 11 can easily dissipate into mounting board 2001 through heat radiator plates 14a and 14b, thereby reducing the temperature of resistive element 11 significantly and improving long term reliability.

The conventional resistor in which a resistive element and a heat radiator plate are bonded with adhesive hardly allows the heat generated in the resistive element to transmit to the heat radiator plate. In the conventional resistor, a thin adhesive to facilitate heat transmission hardly maintain insulation.

In resistor 1001 according to Embodiment 1, resin substrate 13 with high thermal conductivity is made of a mixture of an epoxy resin and alumina powder is formed between resistive element 11 and heat radiator plate 14a and between resistive element 11 and heat radiator plate 14b. This configuration allows resin substrate 13 which has a high thermal conductivity and high insulation as mentioned above to be bonded securely to resistive element 11 and heat radiator plates 14a and 14b.

Resin substrate 13 with a high thermal conductivity is preferably bonded to resistive element 11 and heat radiator plates 14a and 14b without adhesive. The thermal conductivity will be maintained, even if thickness of resin substrate 13 is increased to improve insulation. On the other hand, adhesive may deteriorate the thermal conductivity in the case that the thickness of resin substrate 13 is large.

Resin substrate 17 is made of glass epoxy which is contained in mounting board 2001. This configuration prevents solder cracking caused by a difference in thermal expansion coefficient between resin substrate 17 and mounting board 2001 of resistor 1001 after mounting. Furthermore, excellent heat resistance is obtained.

In other words, resin substrate 13 with a high thermal conductivity made of a mixture of an epoxy resin (resin 13*r*) and alumina powder (ceramic powder 13*p*) and resin substrate 17 made of glass epoxy are laminated to improve long term reliability of resistor 1001, an increase in the withstanding voltage thereof, preventing of solder cracking, and heat resistance.

Figure 1C:
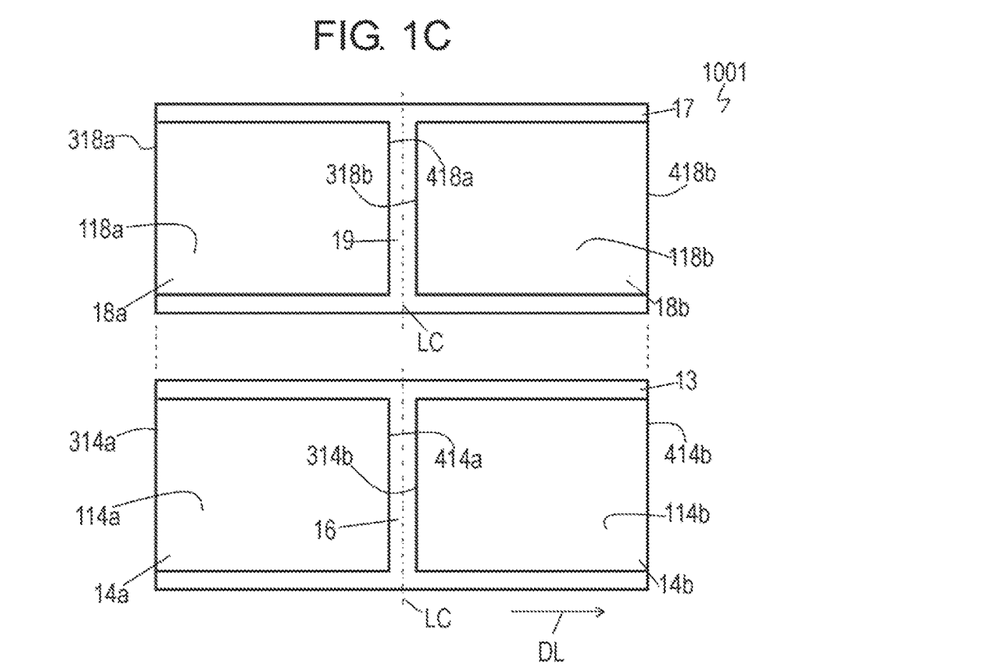
FIG. 1C is a top view of a heat radiator plate of the resistor shown in FIG. 1B.

FIG. 1C is a top view of heat radiator plates 14*a*, 14*b*, 18*a*, and 18*b* of resistor 1001. End 414*a* of heat radiator plate 14*a* and end 314*b* of heat radiator plate 14*b* which face each other via gap 16 extend straightly in parallel to each other. Gap 16 extends straightly. Similarly, end 418*a* of heat radiator plate 18*a* and 318*b* of heat radiator plate 18*b* which face each other via gap 19 extend straightly in parallel to each other. Gap 19 extends straightly.

In resistor 1001 according to Embodiment 1 shown in FIG. 1C, gaps 16 and 19 are located at the same position viewing from above. This configuration allows shapes of gap 19 or resin substrate 13 with a high thermal conductivity to be checked easily from above.

In resistor 1001 shown in FIG. 1C, both gaps 16 and 19 are provided along center line LC which passes through the center of resistor 1001 (resistive element 11) in longitudinal direction DL and which is parallel to upper surface 111 of resistive element 11 and perpendicular to longitudinal direction DL. Thus, heat radiator plates 14*a*, 14*b*, 18*a*, and 18*b* can perform heat dissipate of resistive element 11 in longitudinal direction DL in a well-balanced.

Figure 1D:
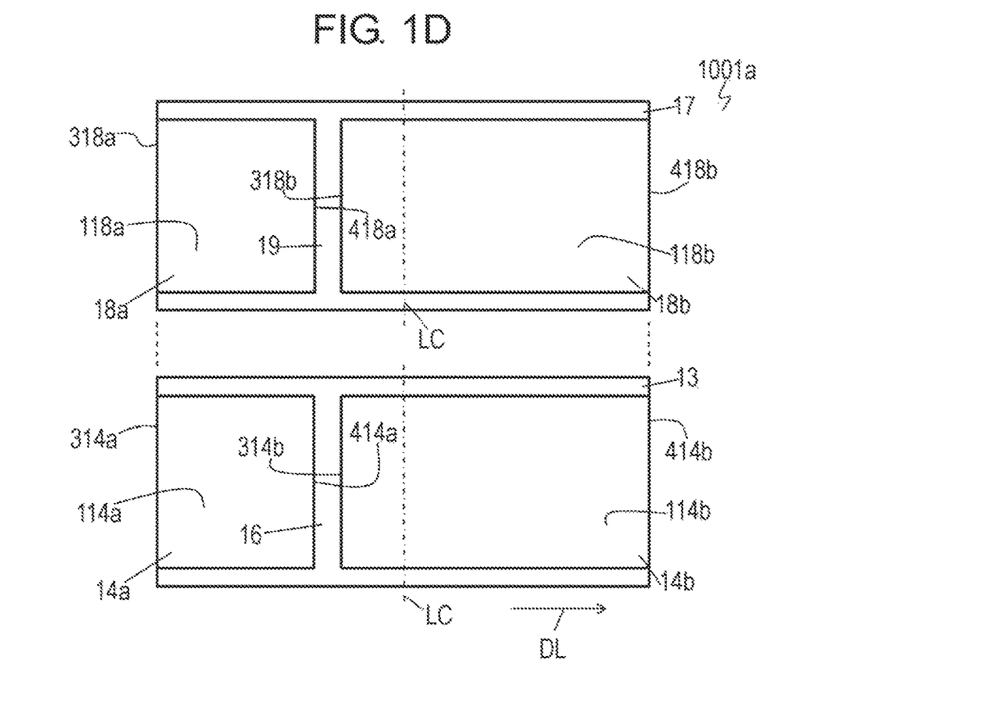
FIG. 1D is a top view of a heat radiator plate of another resistor in accordance with Embodiment 1.

FIG. 1D is a top view of heat radiator plates 14*a*, 14*b*, 18*a*, and 18*b* of another resistor 1001*a* in accordance with Embodiment 1. In FIG. 1D, components identical to those of resistor 1001 shown in FIGS. 1A to 1C are denoted by the same reference numerals. In resistor 1001*a* shown in FIG. 1D, gaps 16 and 19 are located at the same position viewing from above, and deviate from center line LC of resistor 1001*a*. In resistor 1001*a*, heat radiator plates 14*b* and 18*b* are provided above hot spots of resistive element 11, thereby improving heat dissipation. Furthermore, mechanical strength can increase.

Figure 2A:
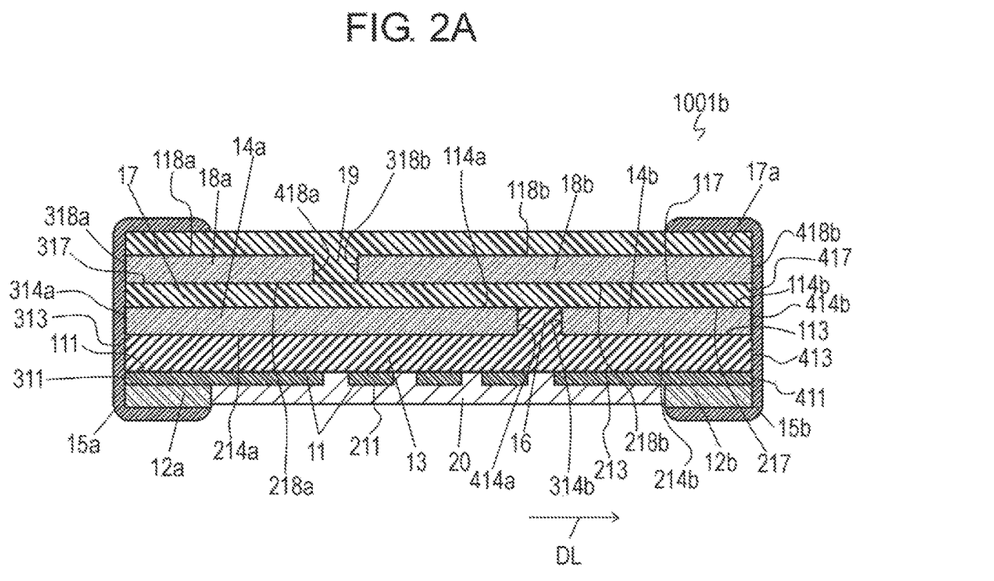
FIG. 2A is a cross-sectional view of another resistor in accordance with Embodiment 1.
Figure 2B:
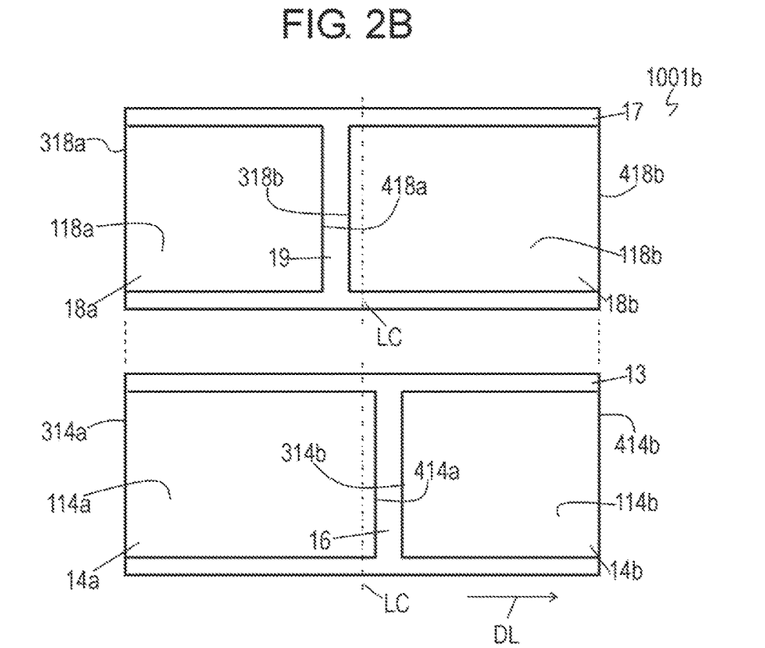
FIG. 2B is a top view of a heat radiator plate of the resistor shown in FIG. 2A.

FIG. 2A is a cross-sectional view of still another resistor 1001*b* in accordance with Embodiment 1. FIG. 2B is a top view of heat radiator plates 14*a*, 14*b*, 18*a*, and 18*b* of resistor 1001*b*. In FIGS. 2A and 2B, components identical to those of resistor 1001 shown in FIGS. 1A to 1C are denoted by the same reference numerals. In resistor 1001*b* shown in FIGS. 2A and 2B, gaps 16 and 19 are located at positions different from each other viewing from above. This configuration increases mechanical strength of resistor 1001*b*. Gaps 16 and 19 extending straightly in parallel to center line LC are symmetrical to each other with respect to center line LC. This configuration strengthens a center portion of resistor 1001*b* efficiently. The center portion of resistor 1001*b* is a portion most deforming most easily by stress.

Gaps 16 and 19 may have a V-shape, an L-shape, or a meandering shape viewing from above. At least one of gap 16 or 19 passes through center line LC viewing from above. This configuration increases mechanical strength of the resistor in accordance with Embodiment 1. Resistors having gaps 16 and 19 with these shapes will be described below.

Figure 2C:
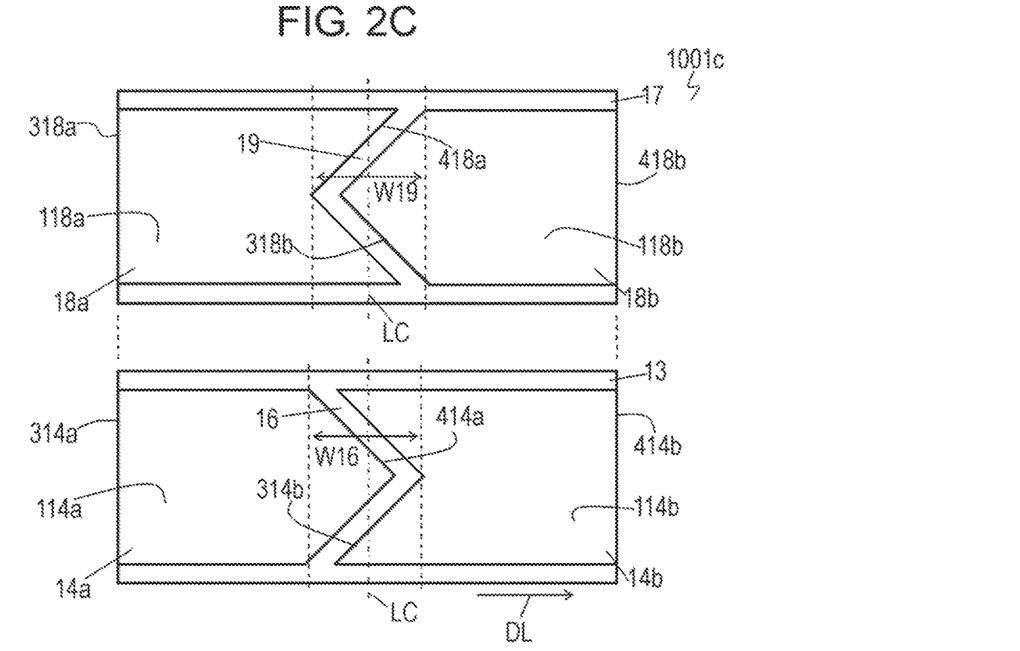
FIG. 2C is a top view of a heat radiator plate of still another resistor in accordance with Embodiment 1.

FIG. 2C is a top view of heat radiator plates 14*a*, 14*b*, 18*a*, and 18*b* of further resistor 1001*c* in accordance with Embodiment 1. In FIG. 2C, components identical to those of resistor 1001*b* shown in FIGS. 2A and 2B are denoted by the same reference numerals.

In resistor 1001*c* shown in FIG. 2C, ends 414*a* and 314*b* of heat radiator plates 14*a* and 14*b* are non-parallel to center line LC. Specifically, end 414*a* of heat radiator plate 14*a* has a V-shape recessed in a direction opposite to longitudinal direction DL while end 314*b* of heat radiator plate 14*b* has a V-shape protruding in the direction opposite to longitudinal direction DL viewing from above. Accordingly, gap 16 has a V-shape protruding in longitudinal direction DL, i.e., passes through center line LC and crosses center line LC viewing from above. Ends 414*a* and 314*b* of heat radiator plates 14*a* and 14*b* cross center line LC viewing from above. However, either end 414*a* of heat radiator plate 14*a* and end 314*b* of heat radiator plate 14*b* may not necessarily cross center line LC. At least one of end 414*a* of heat radiator plate 14*a* and end 314*b* of heat radiator plate 14*b* may cross center line LC. This configuration increases mechanical strength of resistor 1001*c*.

Ends 418*a* and 318*b* of heat radiator plates 18*a* and 18*b* are non-parallel to center line LC. Specifically, end 418*a* of heat radiator plate 18*a* has a V-shape recessed in longitudinal direction DL while end 318*b* of heat radiator plate 18*b* has a V-shape protruding in longitudinal direction DL. Accordingly, gap 19 has a V-shape protruding in a direction opposite to longitudinal direction DL, i.e., passes through center line LC and crosses center line LC viewing from above. Ends 418*a* and 318*b* of heat radiator plates 18*a* and 18*b* cross center line LC viewing from above. However, either end 418*a* of heat radiator plate 18*a* and end 318*b* of heat radiator plate 18*b* may not necessarily cross center line LC viewing from above. At least one of end 418*a* of heat radiator plate 18*a* and end 318*b* of heat radiator plate 18*b* may cross center line LC. This configuration increases mechanical strength of resistor 1001*c*.

In resistor 1001*c* shown in FIG. 2C, viewing from above, range W16 occupied by gap 16 in longitudinal direction DL is substantially aligned with range W19 occupied by gap 19 in longitudinal direction DL. This configuration increases mechanical strength of resistor 1001*c*. Range W16 may not necessarily be aligned with range W19 in longitudinal direction DL viewing from above.

Figure 2D:
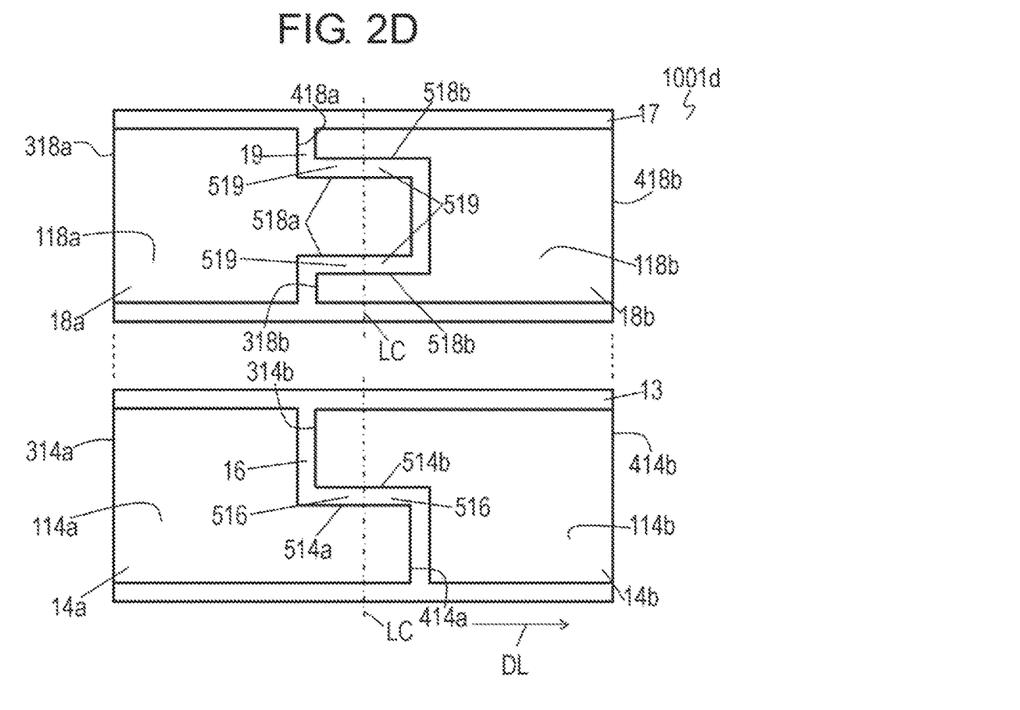
FIG. 2D is a top view of a heat radiator plate of a further resistor in accordance with Embodiment 1.

FIG. 2D is a top view of heat radiator plates 14*a*, 14*b*, 18*a*, and 18*b* of further resistor 1001*d* in accordance with Embodiment 1. In FIG. 2D, components identical to those of resistor 1001*c* shown in FIG. 2C are denoted by the same reference numerals.

In resistor 1001*d* shown in FIG. 2D, ends 414*a* and 314*b* of heat radiator plates 14*a* and 14*b* have respective portions non-parallel to center line LC. Specifically, end 414*a* of heat radiator plate 14*a* has a meandering shape extending in parallel to center line LC while meandering viewing from above, i.e., has portion 514*a* extending in longitudinal direction DL and crossing center line LC. End 314*b* of heat radiator plate 14*b* has a meandering shape extending in parallel to center line LC while meandering viewing from above, i.e., has portion 514*b* extending in longitudinal direction DL and crossing center line LC. Accordingly, gap 16 has a meandering shape extending in parallel to center line LC while meandering, i.e., has portion 516 extended in longitudinal direction DL and crossing center line LC. This configuration increases mechanical strength of resistor 1001*d*.

Ends 418*a* and 318*b* of the heat radiator plates 18*a* and 18*b* have respective portions non-parallel to center line LC. Specifically, end 418*a* of heat radiator plate 18*a* has a meandering shape extending in parallel to center line LC while meandering viewing from above, i.e., has portion 518*a* extending in longitudinal direction DL and crossing center line LC. End 318*b* of heat radiator plate 18*b* has a meandering shape extending in parallel to center line LC while meandering viewing from above, i.e., has portion 518b extending in longitudinal direction DL and crossing center line LC. Accordingly, gap 19 has a meandering shape extending in parallel to center line LC while meandering, i.e., has portions 519 extending in longitudinal direction DL and crossing center line LC. This configuration increases mechanical strength of resistor 1001d.

In resistor 1001d shown in FIG. 2D, portion 516 of gap 16 is located between portions 519 of gap 19, i.e., not aligned with portions 519 of gap 19 viewing from above. This configuration increases mechanical strength of resistor 1001d.

Each of resistor 1001 and resisters 1001a to 1001d shown in FIGS. 1A to 2D may include plural groups each including resin substrate 17 and heat radiator plates 18a and 18b provided on upper surface 117 of resin substrate 17. Such a resistor will be described below.

Figure 3:
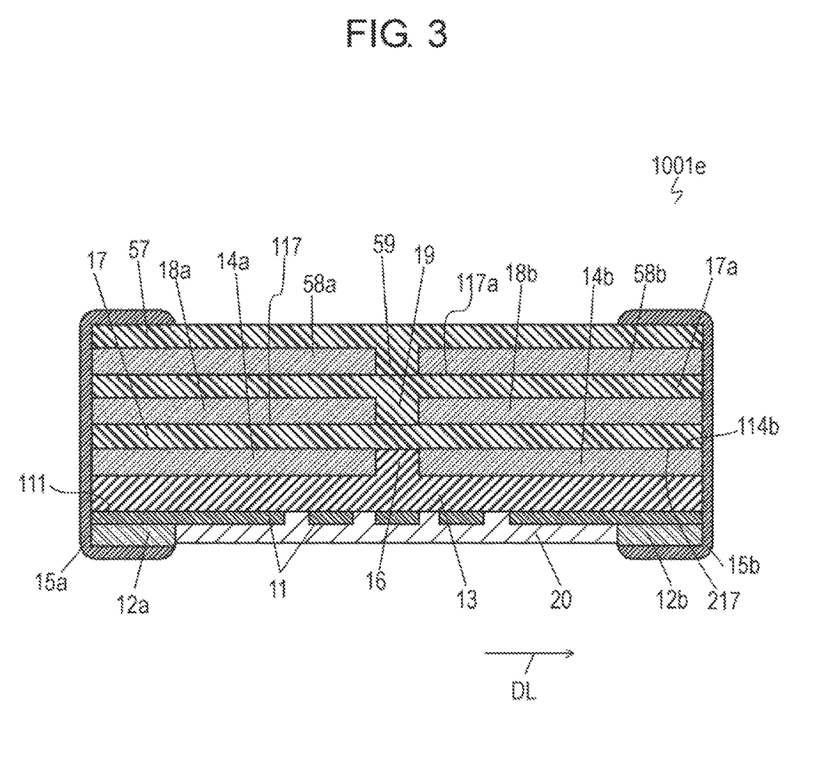
FIG. 3 is a cross-sectional view of a further resistor in accordance with Embodiment 1.

FIG. 3 is a cross-sectional view of further resistor 1001e in accordance with Embodiment 1. In FIG. 3, components identical to those of resistor 1001 shown in FIG. 1A are denoted by the same reference numerals. Resistor 1001e further includes heat radiator plates 58a and 58b provided on upper surface 117 of resin substrate 17 of resistor 1001 shown in FIG. 1A, and resin substrate 57 provided on upper surfaces of heat radiator plates 58a and 58b. Resin substrate 17a is provided on upper surfaces of heat radiator plates 18a and 18b. Resin substrate 57 is made of the same material as resin substrate 17. Similarly to heat radiator plates 18a and 18b, heat radiator plates 58a and 58b are separated from each other via gap 59 and connected to edge-surface electrodes 15a and 15b, respectively. Gap 59 is filled with resin substrate 57. Similarly to resistor 1001 shown in FIG. 1A, resistor 1001e can increase the withstanding voltage and improves long term reliability.

Figure 4:
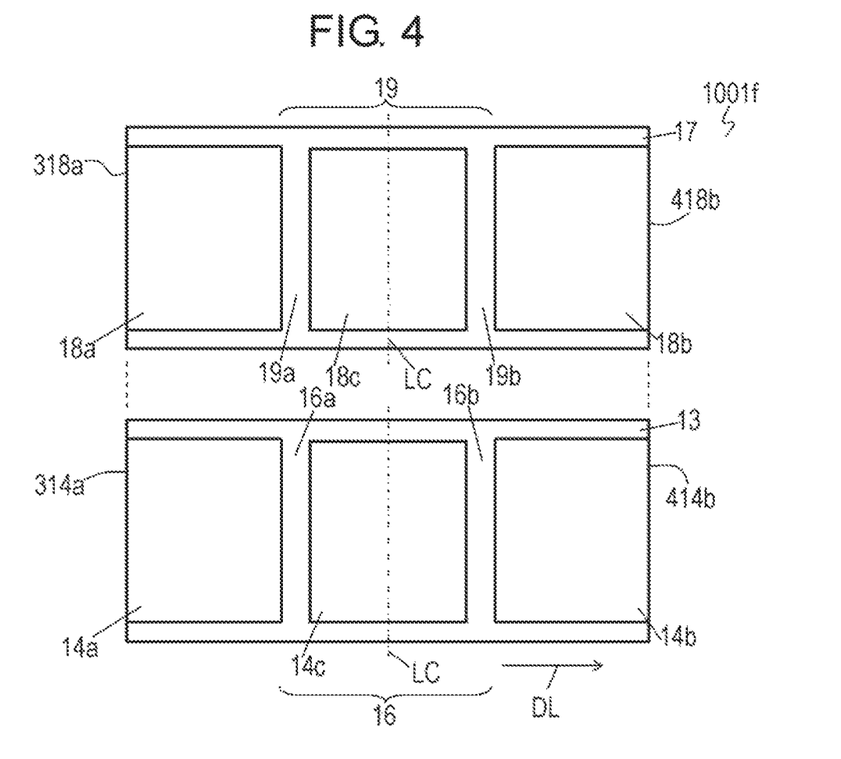
FIG. 4 is a top view of a heat radiator plate of a further resistor in accordance with Embodiment 1.

FIG. 4 is a top view of heat radiator plates 14a to 14c and heat radiator plates 18a to 18c of further resistor 1001f in accordance with Embodiment 1. In FIG. 4, components identical to those of resistor 1001 shown in FIGS. 1A to 1C are denoted by the same reference numerals. Resistor 1001f shown in FIG. 4 further includes heat radiator plate 14c provided on upper surface 113 of resin substrate 13 and heat radiator plate 18c provided on upper surface 117 of resin substrate 17. Heat radiator plate 14c is provided in gap 16 between heat radiator plates 14a and 14b. Heat radiator plates 14a and 14c are separated from each other via gap 16a while heat radiator plates 14b and 14c are separated from each other via gap 16b. Heat radiator plate 18c is provided in gap 19 between heat radiator plates 18a and 18b. Heat radiator plates 18a and 18c are separated from each other via gap 19a while heat radiator plates 18b and 18c are separated from each other via gap 19b.

Protective film 20 shown in FIGS. 1B, 2A, and 3 preferably contains filler made of ceramic powder, such as silica or alumina. This configuration dissipates heat generated in resistive element 11 to protective film 20, thereby reducing the temperature of resistive element 11 more.

Exemplary Embodiment 2

Figure 5A:
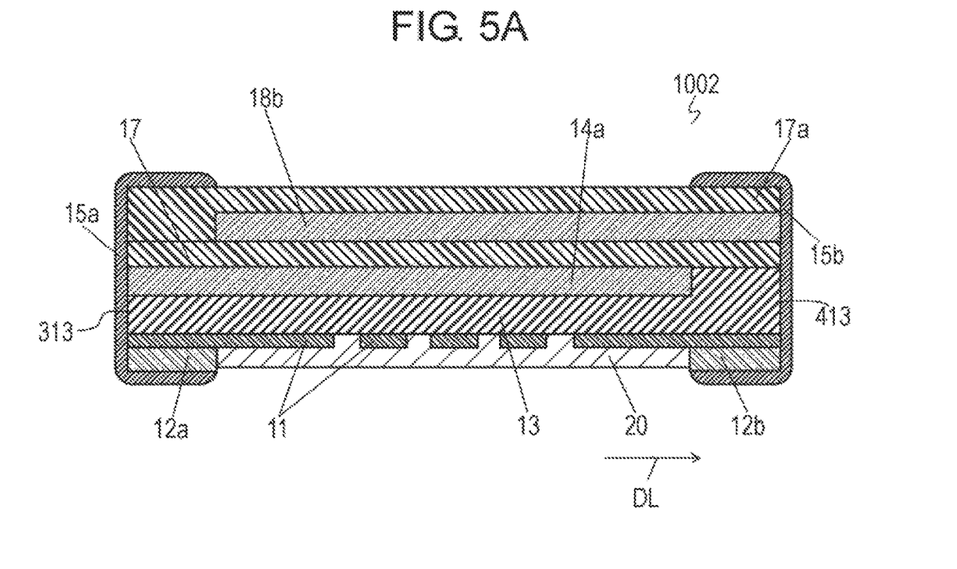
FIG. 5A is a cross-sectional view of a resistor in accordance with Exemplary Embodiment 2.

FIG. 5A is a cross-sectional view of resistor 1002 in accordance with Exemplary Embodiment 2. In FIG. 5A, components identical to those of resistor 1001 in accordance with Embodiment 1 shown in FIG. 1A are denoted by the same reference numerals. Resistor 1002 in accordance with Embodiment 2 includes none of heat radiator plates 14b and 18a of resistor 1001 in accordance with Embodiment 1.

Figure 5B:
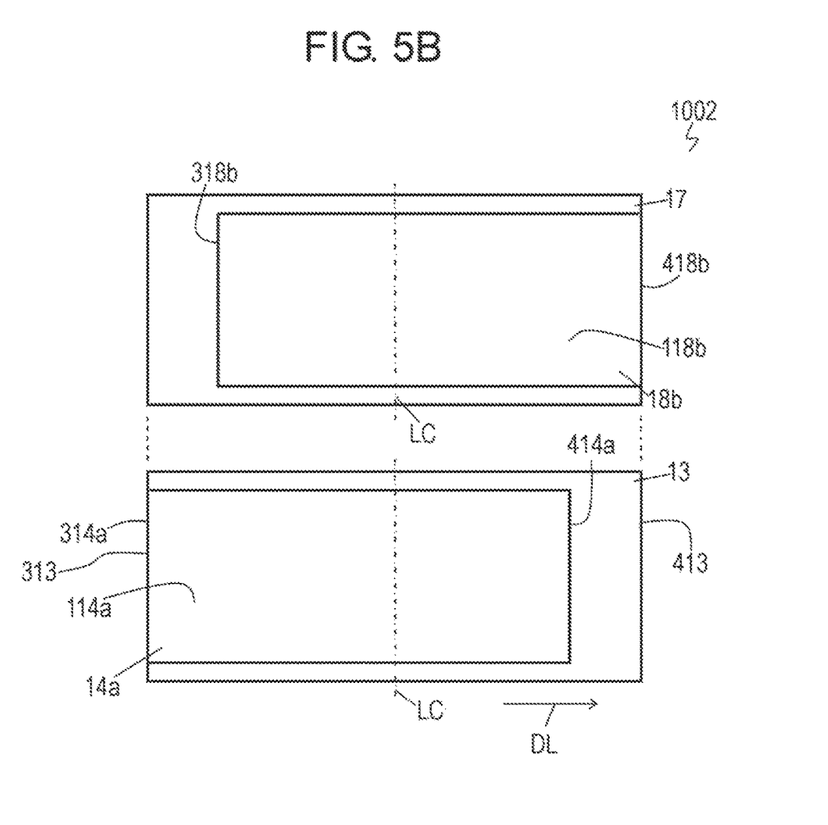
FIG. 5B is a top view of a heat radiator plate of the resistor in accordance with Embodiment 2.

FIG. 5B is a top view of heat radiator plates 14a and 18b of resistor 1002. Heat radiator plate 14a extends beyond center line LC to a position close to end 413 in longitudinal direction DL as not to reach end 413 of resin substrate 13 viewing from above. Heat radiator plate 18a extends beyond center line LC to a position close to end 313 in longitudinal direction DL as not to reach end 313 of resin substrate 13 viewing from above. Heat radiator plates 14a and 18b overlap each other viewing from above.

In resistor 1002, heat radiator plate 14a covering resistive element 11 is elongated, so that the heat generated in resistive element 11 can be dissipated effectively.

In Embodiments 1 and 2, terms, such as "upper surface," "lower surface," and "above," indicating directions indicates relative directions determined only by relative positional relationship of structural elements, such as resistive element 11 and heat radiator plates 14a, 14b, 18a, and 18b, of the resistor, and do not indicate absolute directions, such as a vertical direction.

INDUSTRIAL APPLICABILITY

A resistor according to the present invention improves long term reliability, and is especially applicable to high power and low resistive resistors used for, e.g. detecting a current of various electronic devices.

REFERENCE MARKS IN THE DRAWINGS 11 resistive element
12a lower electrode (first lower electrode)
12b lower electrode (second lower electrode)
13 resin substrate
14a heat radiator plate (first heat radiator plate)
14b heat radiator plate (second heat radiator plate)
15a edge-surface electrode (first edge-surface electrode)
15b edge-surface electrode (second edge-surface electrode)
16 gap (first gap)
17 resin substrate
18a heat radiator plate (third heat radiator plate)
18b heat radiator plate (second heat radiator plate, fourth heat radiator plate)
gap (second gap)

The invention claimed is:
1. A resistor comprising:
a resistive element made of metal and having an upper surface, a lower surface, a first edge surface connected to the upper surface and the lower surface, and a second edge surface connected to the upper surface and the lower surface;
a first resin substrate provided on the upper surface of the resistive element, the first resin substrate having a high thermal conductivity;
a first heat radiator plate made of metal provided on an upper surface of the first resin substrate;
a second heat radiator plate made of metal provided on the upper surface of the first resin substrate such that the second heat radiator plate is separated from the first heat radiator plate via a first gap;
a first edge-surface electrode provided on the first edge surface of the resistive element, the first edge-surface electrode being connected to the first heat radiator plate;
a second edge-surface electrode provided on the second edge surface of the resistive element, the second edge-surface electrode being connected to the second heat radiator plate;
a second resin substrate provided on an upper surface of the first heat radiator plate and an upper surface of the second heat radiator plate;

a third heat radiator plate made of metal provided on an upper surface of the second resin substrate, the third heat radiator plate being connected to the first edge-surface electrode; and a fourth heat radiator plate made of metal provided on the upper surface of the second resin substrate such that the fourth heat radiator plate is separated from the third heat radiator plate via a second gap and is connected to the second edge-surface electrode, wherein the first gap and the second gap are disposed at positions different from each other viewing from above.

2. The resistor according to claim 1, wherein the first resin substrate contains a resin and thermal conductive powder dispersed in the resin.

3. The resistor according to claim 2, wherein the thermal conductive powder is alumina powder or silica powder.

4. The resistor according to claim 1, wherein the first gap and the second gap are symmetrical to each other with respect to a line parallel to the upper surface of the resistive element viewing from above.

5. The resistor according to claim 4,
wherein the first edge surface and the second edge surface of the resistive element are arranged in a longitudinal direction, and
wherein the line passes through a center of the resistor in the longitudinal direction and extends in a direction perpendicular to the longitudinal direction.

6. The resistor according to claim 1,
wherein the first edge surface and the second edge surface of the resistive element are arranged in a longitudinal direction,
wherein the first heat radiator plate and the second heat radiator plate have a first end and a second end extending as to face each other across the first gap, respectively, and
wherein the first end and the second end have respective portions non-parallel to a center line which passes through a center of the resistor in the longitudinal direction and which is perpendicular to the longitudinal direction viewing from above.

7. The resistor according to claim 6, wherein at least one of the first end and the second end crosses the center line viewing from above.

8. The resistor according to claim 6,
wherein the third heat radiator plate and the fourth heat radiator plate have a third end and a fourth end extending as to face each other across the second gap, respectively, and
wherein the third end and the fourth end have respective portions non-parallel to the center line viewing from above.

9. The resistor according to claim 8, wherein at least one of the first end, the second end, the third end, and the fourth end crosses the center line viewing from above.

10. The resistor according to claim 1,
wherein the first edge surface and the second edge surface of the resistive element are arranged in a longitudinal direction, and
wherein the third heat radiator plate and the fourth heat radiator plate have a first end and a second end extending as to face each other across the second gap, respectively, and
wherein the first end and the second end have respective portions non-parallel to a center line which passes through a center of the resistor in the longitudinal direction and which is perpendicular to the longitudinal direction viewing from above.

11. The resistor according to claim 10, wherein at least one of the first end and the second end crosses the center line viewing from above.

12. The resistor according to claim 1,
wherein the resistor is configured to be mounted on a mounting board, and
wherein the second resin substrate is made of material identical to material of the mounting board.

13. The resistor according to claim 1, further comprising:
a first lower electrode provided on a first end portion of the lower surface connected to the first edge surface of the resistive element, the first lower electrode being connected to the first edge-surface electrode; and
a second lower electrode provided on a second end portion of the lower surface connected to the second edge surface of the resistive element, the second lower electrode being connected to the second edge-surface electrode.

14. A resistor comprising:
a resistive element made of metal and having an upper surface, a lower surface, a first edge surface connected to the upper surface and the lower surface, and a second edge surface connected to the upper surface and the lower surface;
a first resin substrate provided on the upper surface of the resistive element, the first resin substrate having a high thermal conductivity;
a first heat radiator plate made of metal and provided on an upper surface of the first resin substrate;
a second resin substrate provided on an upper surface of the first heat radiator plate;
a second heat radiator plate made of metal and provided on an upper surface of the second resin substrate;
a first edge-surface electrode provided on the first edge surface of the resistive element, the first edge-surface electrode being connected to the first heat radiator plate; and
a second edge-surface electrode provided on the second edge surface of the resistive element, the second edge-surface electrode being connected to the second heat radiator plate,
wherein the first heat radiator plate and the second heat radiator plate overlap each other viewing from above.

15. The resistor according to claim 14, further comprising:
a first lower electrode provided on a first end portion of the lower surface connected to the first edge surface of the resistive element, the first lower electrode being connected to the first edge-surface electrode; and
a second lower electrode provided on a second end portion of the lower surface connected to the second edge surface of the resistive element, the second lower electrode being connected to the second edge-surface electrode.

16. The resistor according to claim 1, wherein the first resin substrate is made of material different from material of the second resin substrate.

17. The resistor according to claim 14, wherein the first resin substrate is made of material different from material of the second resin substrate.

18. The resistor according to claim 14, wherein the first heat radiator plate and the second heat radiator plate overlap each other viewing from above at a center of the resistor.

19. A resistor comprising:
a resistive element made of metal and having an upper surface, a lower surface, a first edge surface connected to the upper surface and the lower surface, and a second edge surface connected to the upper surface and the lower surface;
a first resin substrate provided on the upper surface of the resistive element, the first resin substrate having a high thermal conductivity;
a first heat radiator plate made of metal and provided on an upper surface of the first resin substrate;
a second resin substrate provided on an upper surface of the first heat radiator plate;
a second heat radiator plate made of metal and provided on an upper surface of the second resin substrate;
a first edge-surface electrode provided on the first edge surface of the resistive element, the first edge-surface electrode being connected to the first heat radiator plate; and
a second edge-surface electrode provided on the second edge surface of the resistive element, the second edge-surface electrode being connected to the second heat radiator plate,
wherein the first resin substrate is made of material different from material of the second resin substrate.

20. The resistor according to claim 19,
wherein the first resin substrate is made of an epoxy resin and powder dispersed in the epoxy resin, the powder being made of alumina or silica, and
wherein the second resin substrate is made of glass epoxy.

* * * * *